United States Patent [19] | [11] 3,920,931
Yanick, Jr. | [45] Nov. 18, 1975

[54] HEARING AID AMPLIFIERS EMPLOYING SELECTIVE GAIN CONTROL CIRCUITS

[76] Inventor: Paul Yanick, Jr., 1904 Oak Tree Road, Edison, N.J. 08817

[22] Filed: Sept. 25, 1974

[21] Appl. No.: 508,998

[52] U.S. Cl. ........................... 179/107 FD; 179/1 A
[51] Int. Cl.² ........................................ H04R 25/00
[58] Field of Search .......... 179/107 R, 107 FD, 1 A, 179/1 F; 325/410

[56] References Cited
UNITED STATES PATENTS 3,231,686 1/1966 Hueber ........................ 179/107 FD
3,764,745 10/1973 Bottcher ........................ 179/107 R

*Primary Examiner*—Ralph D. Blakeslee
*Attorney, Agent, or Firm*—Arthur L. Plevy

[57] ABSTRACT

There is disclosed a hearing aid amplifier which employs a gain control circuit selectively operative to vary the gain of the amplifier when a predetermined intensity sound signal is applied to the hearing aid incorporating the amplifier. The gain of the amplifier is varied when the intensity of an incoming sound wave exceeds a predetermined level; below this level the gain is held relatively constant.

10 Claims, 5 Drawing Figures

HEARING AID AMPLIFIERS EMPLOYING SELECTIVE GAIN CONTROL CIRCUITS

BACKGROUND OF INVENTION

This invention relates to hearing aids and more particularly to such a device employing a selective gain controlled amplifier.

The ability to control the gain of a hearing aid amplifier is recognized by the prior art and there are a number of techniques which accomplish such results in order to permit a deaf person, or one whose hearing is impaired, to be presented with amplified sound of a truer quality.

Generically, such techniques have been referred to as variable gain control. A major concern of prior art hearing aids is also to limit the gain of the system so that a user will not experience amplified sounds which approach or exceed common pain levels associated with sound. Thus many aids employing gain control systems refer to output limitation as a desirable characteristic.

In any event, one can typically state that in most hearing aids, weak input sounds are amplified to a greater extent than are loud sounds. The techniques used in the prior art have been referred to as peak clipping, AVC or automatic volume control, Curvilinear or Non-linear Compression and LDC or Linear Dynamic Compression. A good review of such techniques appears in an article entitled "OUTPUT LIMITATION" by Jorgen Heide published in Hearing Instruments, August, 1974, pages 26 to 28.

Suffice it to say that there are numerous other publications describing a wide variety of amplifiers with gain control of one sort or another which are employed in such devices as hearing aids and which all purportedly serve to enhance the quality of sound directed to a user of such instruments.

Basically, most prior art devices operate to amplify low level sounds with a greater amplification factor than high level sounds. Since a sound wave has a complex power spectrum, such prior art devices respond to low level background noise and hence raise the gain of the amplifier because of low level background noise, thus increasing the gain and undesireably affecting the true sound that the user wishes to hear.

The proper hearing level is dependent upon the patient, his hearing loss and also upon his own aesthetic considerations. Briefly, each person has his own most unaided comfort level at which level he will most clearly hear speech or other intelligible audio information.

While the prior art is cognizant of such levels and considerations, the gain controlled devices employed not only adversely effect such considerations, but in operation, clip and further distort the audio waves by producing harmonic distortion and cross and inter modulation distortion to therefore actually distort the sound waves.

It is therefore an object of this invention to provide a hearing aid device having a selective gain controlled amplifier, which amplifier will serve to vary the gain of the hearing aid only after the incoming sound intensity signal exceeds a predetermined level indicative of the patient's own comfort level.

BRIEF DESCRIPTION OF PREFERRED EMBODIMENT

A hearing aid device comprising a transducer means for producing electrical signals corresponding to received audio signals, a gain controllable amplifier means coupled to said transducer means and operative to provide a relatively constant gain over a desired audio frequency range and means for varying the gain of said amplifier when the intensity of said audio signal exceeds a a predetermined sound intensity level in the vicinity of forty decibels.

DETAILED DESCRIPTION OF FIGURES

Figure 1:
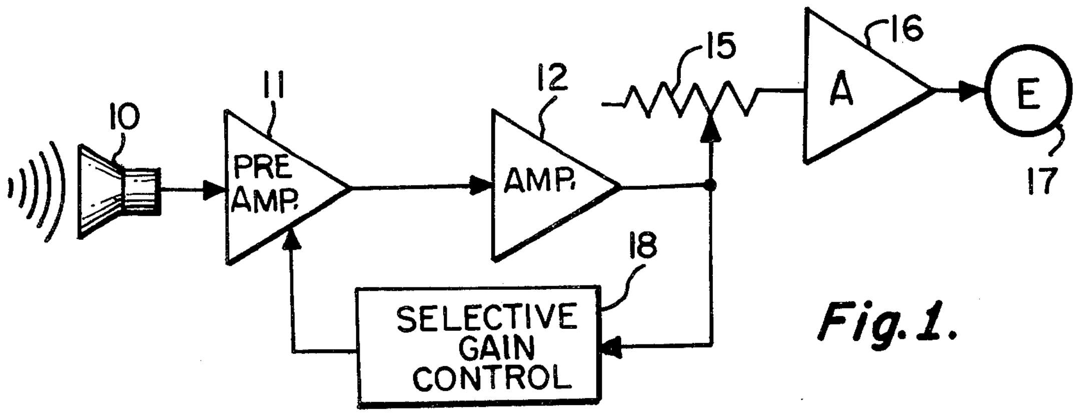
FIG. 1 is a block diagram of a hearing aid device.

Referring to FIG. 1, there is shown a typical block diagram of a hearing aid device of conventional design and is presented by way of explanation to characterize the prior art to gain and afford a better and clearer understanding of the nature of the present invention.

A microphone 10 is a basic part of a hearing aid and serves to respond to sound waves to convert the same into electrical signals indicative of both the frequency and amplitude of the sound as impinging upon the diaphragm or cone of the microphone 10.

Such microphones as 10 are readily available as commercial components and many are adapted for use in the hearing aid environment.

The output of the microphone is applied to the input of a pre-amplifier 11. The function of the pre-amplifier is to provide gain to the signal emanating from the loud speaker at a realtively wide-band of audio frequencies. Generally, the gain of such amplifiers used in hearing aids is quite large and such devices, for example, provide quiescent gains of 30,40 or 50 decibels. In order to accommodate such large gain factors, one usually employs more than a single stage of amplification.

Hence the output of the pre-amplifier 11 is coupled to the input of an intermediate amplifier stage 12 whose output is coupled via a volume control or potentiometer 15.

The gain control 15 may be used by the handicapped to set the volume to that desired.

An output amplifier 16 is shown to provide an additional gain factor and to provide the necessary impedance matching in order to drive an earphone 16. The earphone 16 may be a small or ultraminiature speaker and is used to transform the electrical signals emanating from the output amplifier 16 to acoustic signals which are then coupled or fed to the ear or ears of the deaf person.

Also shown coupled between the output of amplifier 12 and a gain controllable input of the pre-amplifier 11, is a module 18 designated as a selective gain control.

The prior art may also utilize such a device which, as indicated above, serves to limit or control the gain of the amplifier to vary the same according to the intensity of the input signal to thereby afford the user a gain controlled device. As indicated, such prior art devices suffer in that such circuits are sensitive to background or low level noise and hence may raise the gain of an amplifier undesireably to therefore interfere with or disturb with the desired signal. The gain control circuit 18 may also operate to limit the gain of the amplifier so as not to exceed levels about and above say 105–110 decibels which would cause pain to the hearing impaired ear.

As such, prior art systems suffer in that they also produce distortion in regard to the non-linear amplification of such sound waves and so on.

I have discovered that a most desireable and preferred operating mode for such a selective gain control circuit as 18 is to keep the amplifying gain constant for all levels and values of sound intensity below a given level determined by a patient's most comfortable level and to thereafter vary the gain according to the intensity of the incoming sound signals. The gain control should be provided at a relatively constant band-width to thereby provide the user with an accurate and reliable hearing aid.

Basically, the gain of a hearing aid is determined by the extent of the hearing loss of the deaf person.

Such amplifiers may therefore have quiescent gains of of 30, 40 or 50 decibels, which quiescent gain is determined by the hearing loss of the patient.

Figure 2A:
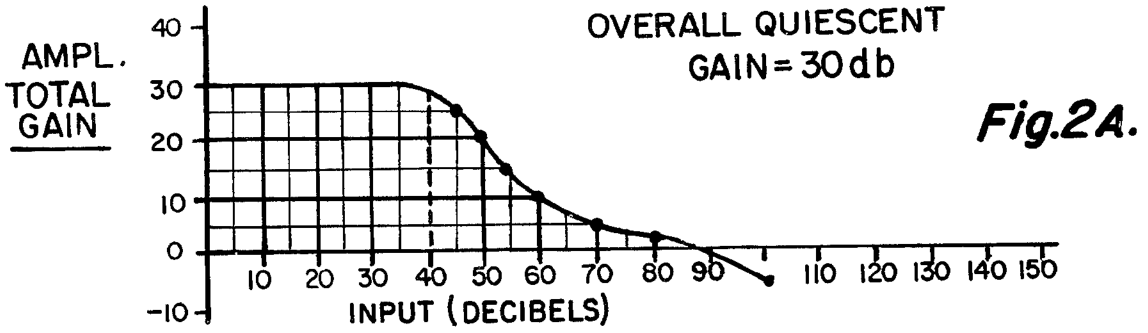
FIGS. 2A to 2C are graphs depicting the gain control characteristics of a hearing aid amplifier according to this invention.
Figure 2B:
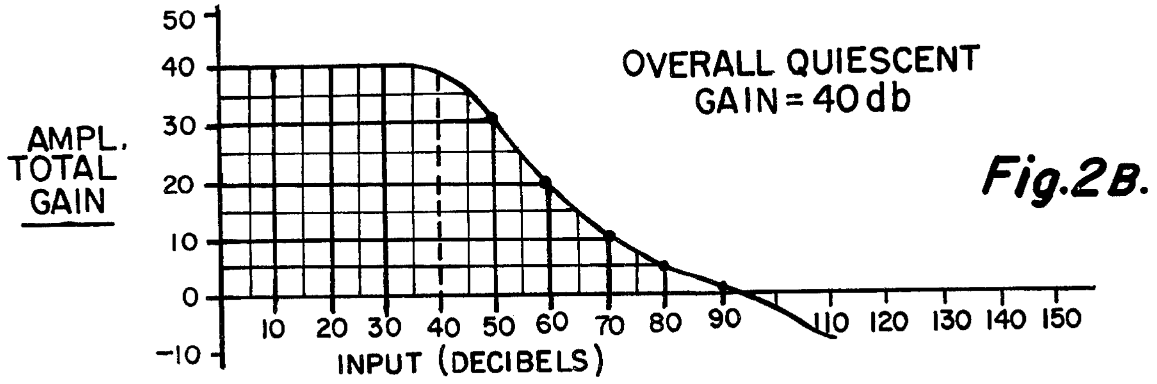
Figure 2C:
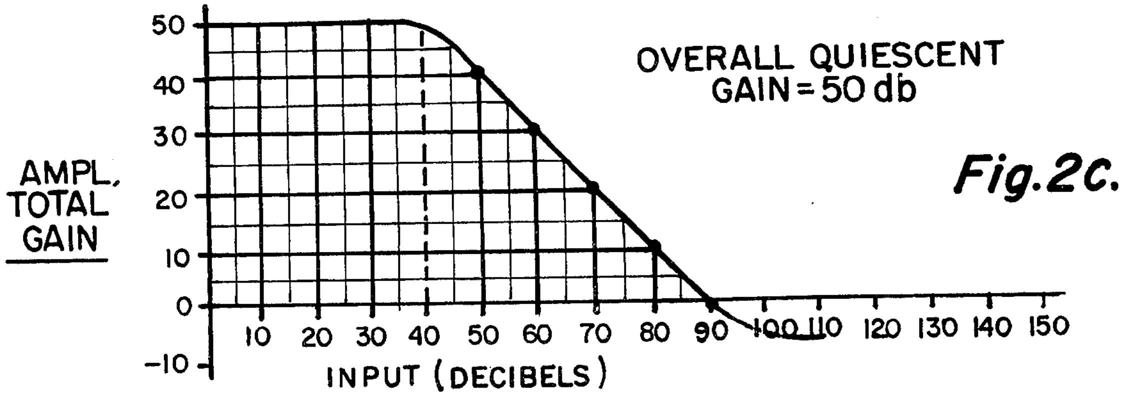

FIGS. 2A to 2C shows the gain versus input level for three amplifiers which operate according to this invention.

Basically, each amplifier is designed to operate at a fixed gain without gain control, as 30 decibels for that of FIG 2A, 40 decibels for that of FIG. 2B and 50 decibels for that of FIG. 2C.

As can be ascertained from the diagrams or graphs, the gain is held constant for all levels below, say 40 decibels and thereafter reduced accordingly for levels above 40 decibels. The exact nature of the gain and the overall output are shown in the Tables. It is understood that the reference level for a decibel is 0.0002 dynes per sq. cm. It is understood that the input decibel level plus the decibel gain of the amplifier add to give the output level, as indicated in the Tables. For an amplifier without gain control that has a quiescent gain of 50 db the output level for an input intensity of 50 db will be 100 decibels and so on. The Tables therefore show the input level in decibels, the desired gain of the amplifier at that level and the subsequent output level.

TABLE I (30 decibel (db) gain)

| INPUT LEVEL (decibels) | | TOTAL AMPLIFIER GAIN | | OUTPUT LEVEL (db) |
|---|---|---|---|---|
| 20 | + | 30 | = | 50 |
| 30 | + | 30 | = | 60 |
| 40 | + | 30 | = | 70 |
| 50 | + | 23.5 | = | 73.5 |
| 60 | + | 17 | = | 77 |
| 70 | + | 10.5 | = | 80.5 |
| 80 | + | 4 | = | 84.00 |
| 90 | – | 2.5 | = | 87.5 |
| 100 | – | 9 | = | 91 |

TABLE II (40 decibel (db) gain)

| INPUT LEVEL (decibels) | | TOTAL AMPLIFIER GAIN | | OUTPUT LEVEL (db) |
|---|---|---|---|---|
| 20 | + | 40 | = | 60 |
| 30 | + | 40 | = | 70 |
| 40 | + | 40 | = | 80 |
| 50 | + | 32.5 | = | 82.5 |
| 60 | + | 25 | = | 85 |
| 70 | + | 17.5 | = | 87.5 |
| 80 | + | 10 | = | 90 |
| 90 | + | 6.5 | = | 96.5 |
| 100 | – | 1 | = | 99 |
| 110 | – | 8.5 | = | 101.5 |

TABLE III (50 decibel (db) gain

| INPUT LEVEL (decibels) | | TOTAL AMPLIFIER GAIN | | OUTPUT LEVEL (db) |
|---|---|---|---|---|
| 20 | + | 50 | = | 70 |
| 30 | + | 50 | = | 80 |
| 40 | + | 43.5 | = | 83.5 |
| 50 | + | 37 | = | 87 |
| 60 | + | 30.5 | = | 80.5 |
| 70 | + | 24 | = | 94 |
| 80 | + | 17.5 | = | 97.5 |
| 90 | + | 11 | = | 101 |
| 100 | + | 4.5 | = | 104.5 |
| 110 | – | 2 | = | 108 |

As can be seen from the graphs and tables, the comfortable level for a handicapped person requiring a hearing aid with a gain of 30 db is about 60 decibels of total output level, while that of a user requiring a 40 db gain is about 70 decibels and so on.

The problem above specified is as follows: If a hearing aid device employs a gain control, the user can experience the following problems:

First, the automatic gain control circuit would respond to background noise. For example, there is a radio playing or other background noise and a user having a hearing aid is engaged in a conversation. In this fashion, the automatic gain control circuit would respond to the background noise during the absence of conversation and raise the gain of the amplifier. Thus, when conversation resumes, the gain would be higher than desired and hence the user would have problems.

Since sound waves are complex in nature and since the waves mix or are applied to the hearing aid microphone simultaneously, it is extremely difficult to discriminate against undesired sounds.

In this invention, if the sound levels due to background and the levels due to the conversation are both less than say 40 decibels, there is no change in gain whatsoever and the amplifier as controlled maintains the quiescent gain of 30,40 or 50 decibels as shown in the Tables and FIGS. 2A to 2C, respectively.

However, the following situations can also occur. Namely, the sound level of the undesired sound or background noise can exceed 40 decibels, while the conversation does not. Theoretically, under such conditions, the prior art systems would probably lower the gain of the amplifier and therefore the user could not respond well to conversation since the aid would operate at less than the quiescent gain of the amplifier.

In this manner the invention herein discriminates between steady state or repetitive noise signals and spurious signals as speech to maintain the gain dependent upon the desired signal.

Hence in the instance where the intensity of the background noise is less than say 40 decibels and the desired signal is greater, then gain control will be maintained and the system will give the user more discrimination against the undesired signal.

For all signal levels below the threshold level of 40 db, the amplifier operates with the quiescent gain and no variation is required which enables a clearer presentation of audio to the user.

Figure 3:
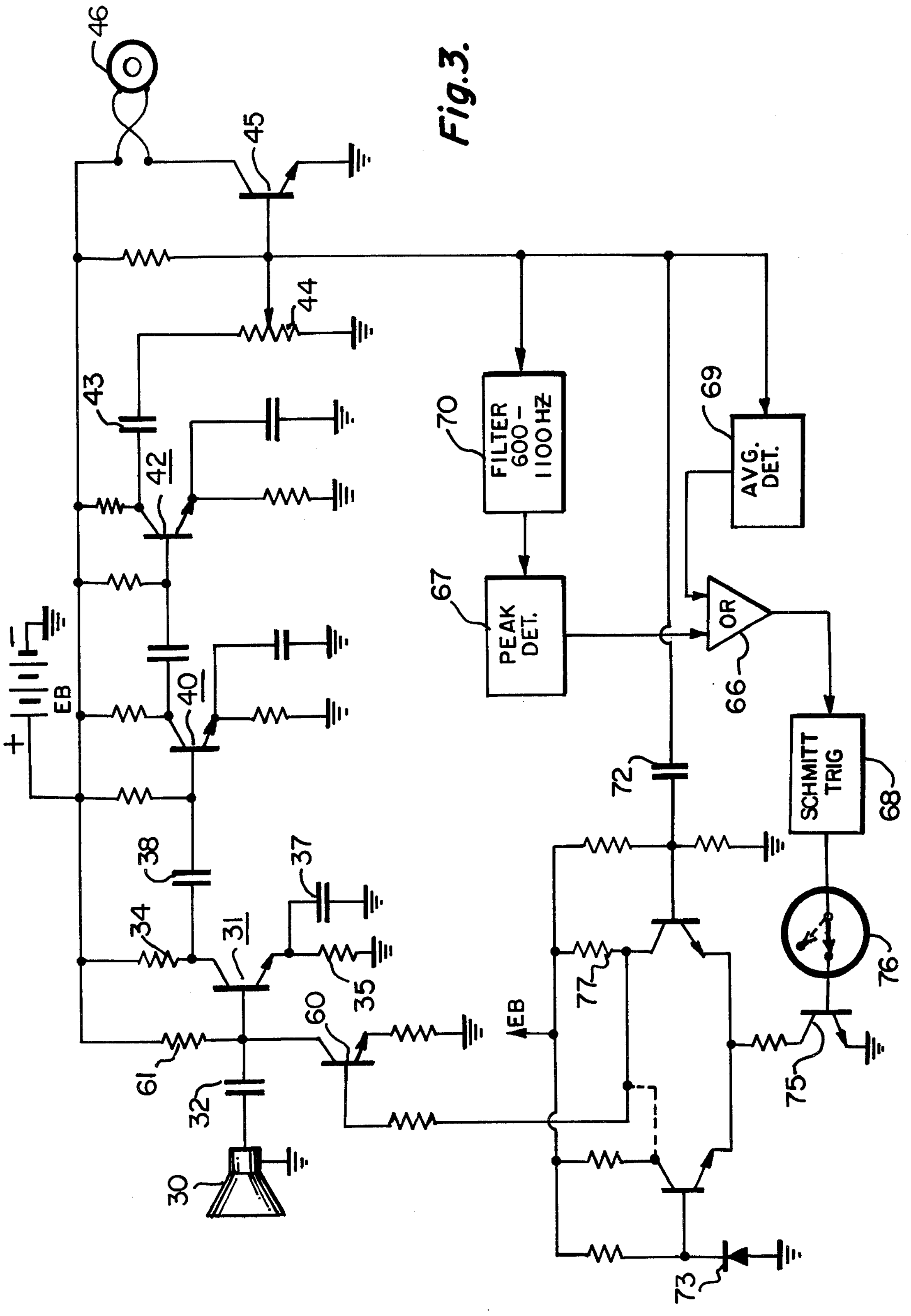
FIG. 3 is a partial block and schematic diagram of a hearing aid device according to the invention.

Referring to FIG. 3, there is shown an amplifier with selective gain control according to the invention and whose gain can vary as shown in FIGS. 2A, 2B and 2C.

An input microphone 30 applies incoming audio signals to the base electrode of a common emitter amplifier section 31 via a coupling capacitor 32.

The common emitter amplifier 31 has a collector electrode coupled to a hearing aid battery 33 which may be a 1.5 volt miniature type. The collector is coupled to the battery 33 via a load resistor 34. An emitter resistor 35 is used for negative feedback to accommodate a given amount of degeneration to afford a wider frequency response. The emitter electrode may be bypassed for high frequencies by capacitor 37.

The output of amplifier 31 is coupled via capacitor 38 to the base electrode of another common emitter stage 40 similarly connected and used to develop the required total amplifier gain. The output of this amplifier 40 is similarly coupled to still another common emitter amplifier 42, which operates accordingly. The collector electrode of amplifier 42 is coupled via a d.c. blocking capacitor 43 to a volume control potentiometer 44, to enable a user to vary the gain by varying the amount of signal applied to the output common emitter amplifier 45 for driving the earphone 46.

Thusfar, the amplifier chain is typical of those used in prior art devices, realizing that the amount of gain desired is a function of the gain of each stage in the cascaded chain. Hence a typical chain of four amplifiers can provide an overall gain of 40,50 or 60 decibels or more or less of a gain as may be required by a particular user.

A selective gain control circuit operates with the signal at the base electrode of transistor 45 or that signal after an adjustment in the volume control 44 has been made, which control 44 is presumably set for the user's most comfortable level.

The circuit operates as follows:

First assume that all audio signal intensity is below the value of 40 decibels. In this instance a transistor 60 coupled to the base electrode of transistor 31 is saturated and is conducting current. The transistor 60 forms a voltage divider with the base bias resistor 46 of transistor 61 and transistor 31 is therefore biased at a low current conducting point on its characteristic specifying a given gain. If all levels are below 40 decibels, the Schmitt trigger circuit 65 is not activated. As is known, a Schmitt trigger is a conventional circuit which provides a given output level when an input level exceeds a predetermined value. The Schmitt trigger 65 is fed from an analog OR gate circuit 66; having one input suppled from a peak detector circuit 67 and an average detector circuit 68.

The peak detector 67 is preceded by a selective filter 70 which may operate in the range of 600 to 1100 Hertz which is well within the fundamental voice frequency of the human and is in the center of the maximum power output with frequency of most musical instruments.

The input to the filter 70 is coupled to the volume control 44 as is the input to the average detector 68.

A differential amplifier circuit 71 also has the base electrode of one transistor coupled to the input from the volume control 44 via a AC coupling capacitor 72.

A reference level is supplied at the other base by a Zener diode 73. A constant current transistor 75 is coupled between the common emitter connections of the differential amplifier transistors to provide a ground return for the amplifier 71 and to assure relatively constant gain. The base electrode of transistor 75 is coupled to the output of the Schmitt trigger 65 via a switch 76. The switch 76 enables the user to turn off gain control and hence to cause the transistor amplifier to operate at quiescent gain. This is necessary as a user might be at a play, concert or a similar public presentation, where the sound is good and hence he need not employ gain control as the levels and control of audio are ascertained.

In any event, when the signal levels do not exceed 40 decibels, the Schmitt trigger is inactive and hence transistor 75 is biased off. Thus transistor 60 is biased on via the collector resistor 77 in the collector of one side of the differential amplifier.

Now assume that there is substantial background noise from a loud radio a typewriter or some other noise producing source. Noise of this sort is continuous and may have both high peak and average values.

In this case, the average detector will respond to the background noise and produce a DC value exceeding the 40 decibels threshold. If the noise is also within the range of filter 70, it will also cause the peak detector to prpvide a DC level. Both circuits may then be activated and the DC provided with be applied to the OR gate 66, which sends a enable signal to the Schmitt trigger for such levels above 40 decibels. The Schmitt trigger 65 latches and biases transistor 75 to conduct. The conduction of transistor 75 turns on the differential amplifier 71. Since the Schmitt trigger 75 is activated, the audio signal at the volume control is also representative of a signal level greater than 40 decibels. The bias on transistor 31 is lowered due to the conduction of transistor 60.

The transistor's 60's base may be applied to the other collector of the differential amplifier 70 to assure a signal of opposite polarity to the input signal and hence a reduction in gain is likewise afforded. Since the Schmitt trigger 65 is activated the gain of the overall amplifier begins to decrease according to the intensity of the input signal as the differential amplifier serves to vary the gain in a linear manner.

Now assume that the background noise is less than 40 decibels, but the desired signal is greater than 40 decibels; however the average power of both signals is still less than 40 decibels.

In this instance, the peak detector of the desired signal is within the range of 600 to 1100, Hertz will respond to the 40 decibel peaks of the desired signal, while the average power is less than 40 decibels total.

The peak detector 67 will then trigger the Schmitt 65 and gain control is again afforded. Since the gain of the amplifier has decreased, the user will hear the desired signal within a more comfortable range as it will be controlled. The background signal will also be controlled but will remain in proportion at a comfortable level to the user since the combination of both signals is less than 40 decibels.

Now assume the background signal is greater than 40 decibels and the desired signal is less. This will present a problem to both the handicapped user and anyone he may be communicating with. In this case the average detector will cause the Schmitt trigger to fire, thus reducing the gain of the amplifier. Since the desired signal source is usually closer to the user, he will still be in a better position to hear the desired sounds.

The advantages of the system described are many;

1. The user is supplied with a constant gain for all signals below a comfort level and hence, he hears with the necessary gain in all instances below this value.

2. The circuit will decrease the gain of the amplifier for a loud desired signal even though there is background noise of significant value and hence the background noise through the reduced gain will also be decreased enabling him to better concentrate on desired sounds.

3. He can completely eliminate the control via the switch 76 and hence operate his aid at a fixed gain.

4. The bandwidth is wide, say in excess of 8000 c.p.s. because of the negative feedback and will be maintained as the gain is fixed over a relatively wide level of input signals and then is decreased for increasing levels to therefore assure wide gain operation.

5. For all types of signals exceeding the comfortable level, he has optimum gain control due to the operation of the circuit.

6. The attack time or the time required for operating the circuit is extremely fast as there are no large time constants in the circuit. Since the Schmitt trigger is a rapid responding device, the gain control afforded is relatively instantaneous, thus avoiding "dead time" or maintaining an optimum gain for extended periods.

The entire circuit can be fabricated using integrated circuit techniques and hence be ultraminiature and no larger than existing hearing aid components.

I claim:

1. A hearing aid device comprising:

a. transducer means for providing electrical signals corresponding to received audio signals, b. gain controllable amplifier means coupled to said transducer means and operative to provide a relatively constant gain over a desired audio frequency, and c. means for varying the gain of said amplifier when the intensity of said audio signal exceeds a predetermined sound intensity level in the vicinity of forty decibels; whereby the gain of said controllable amplifiers remains constant for all intensity levels below said vicinity and is decreased for all intensity levels above said vicinity of forty decibels; said means for varying the gain including first and second detecting means, said first means responsive to the peak value of certain of said audio signals in excess of said level and said second means responsive to the average value of all audio signals in excess of said intensity level for varying the gain of said amplifier according to such both said first and second means.

2. A hearing aid device comprising:

a. transducer means for providing electrical signals corresponding to received audio signals, b. first gain controllable means including an average detector coupled to said transducer means and operative to provide a relatively constant gain for a first range of audio signals of an intensity between 0 and 50 decibels, and c. second controllable means including a peak detector responsive to audio signals in excess of the upper range of intensity to decrease the gain of said amplifier for all input signals above said desired range.

3. A hearing aid device comprising a. transducer means for producing electrical signals corresponding to received audio signals, b. a gain controllable amplifier coupled to said transducer means and operative to provide a relatively constant gain for a first range of said audio signals of an intensity between 0 to 50 decibels, c. a selective filter responsive to a given frequency range of said audio signals indicative of desired audio information to provide at an output, audio signals encompassed within said given frequency range, d. first detecting means responsive to the peak value of said signals within said range to provide a control output signal when said peaks are in excess of the upper limit of said first range, e. second detecting means responsive to the average value of all audio signals to provide a second control signal when the intensity of all audio signals exceed the upper limit of said first range, f. combining means operative to provide an output signal during the presence of said first or second control signal, g. gain control means responsive to said output signal of said combining means to vary the gain of said amplifier during the presence of said first or second control signals.

4. The hearing aid device according to claim 3 wherein said selective filter operates within the range of 600 to 1100 Hertz.

5. The hearing aid device according to claim 3 wherein said first detecting means consist of a peak detector circuit.

6. The hearing aid device of claim 3 wherein said combining means consist of an OR gate.

7. The hearing aid device according to claim 3 wherein said gain control means comprise:

a. a Schmitt trigger operative to provide a bias signal upon application to an input of said output signal, b. a differential amplifier responsive to said bias signal and having an output coupled to said gain controllable amplifier for varying the gain only during the presence of said bias signal.

8. The device according to claim 7 further comprising:

a. means for disabling said differential amplifier to enable operation of said gain controllable amplifier at said relatively constant gain.

9. The hearing aid device according to claim 3 further including frequency compensating means coupled to said gain controllable amplifier.

10. The hearing aid device according to claim 7 wherein said differential amplifier includes a constant current source transistor having a base electrode responsive to said bias signal emanating from said Schmitt trigger to cause said differential amplifier to operate.

* * * * *